United States Patent
Simmons et al.

[11] Patent Number: 6,167,054
[45] Date of Patent: Dec. 26, 2000

[54] METHOD AND APPARATUS PROVIDING PROGRAMMABLE THRESHOLDS FOR FULL-DUPLEX FLOW CONTROL IN A NETWORK SWITCH

[75] Inventors: Philip Simmons, San Jose; Bahadir Erimli, Mountain View; Jinqlih Sang, Fremont; Peter Ka-Fai Chow; Ian Crayford, both of San Jose; Jayant Kadambi, Milpitas; Denise Kerstein, Mountain View; Thomas Jefferson Runaldue, San Jose, all of Calif.

[73] Assignee: Advanced Micro Devices, Inc., Sunnyvale, Calif.

[21] Appl. No.: 08/992,913

[22] Filed: Dec. 18, 1997

Related U.S. Application Data

[60] Provisional application No. 60/038,025, Feb. 14, 1997.

[51] Int. Cl.[7] .................................................. H04L 12/28
[52] U.S. Cl. ........................................... 370/422; 370/412
[58] Field of Search ..................................... 370/236, 410, 370/412, 422, 426, 468, 449, 522; 709/233, 234, 235; 364/239.1, 239.6; 395/200.64

[56] References Cited

U.S. PATENT DOCUMENTS

| | | | |
|---|---|---|---|
| 5,515,376 | 5/1996 | Murthy et al. . | |
| 5,673,254 | 9/1997 | Crayford | 370/231 |
| 5,828,653 | 10/1998 | Goss | 370/230 |
| 5,838,922 | 11/1998 | Galand et al. | 395/200.62 |
| 5,896,379 | 4/1999 | Haber | 370/390 |
| 5,901,147 | 5/1999 | Joffe | 370/412 |
| 5,905,870 | 5/1999 | Mangin et al. | 395/200.64 |

FOREIGN PATENT DOCUMENTS

| | | |
|---|---|---|
| 0 748 087 A1 | 12/1996 | European Pat. Off. . |
| WO 96/41455 | 12/1996 | WIPO . |

*Primary Examiner*—Huy D. Vu
*Assistant Examiner*—Alexander Boakye

[57] ABSTRACT

A network having a shared memory architecture for storing data frames has a set of programmable thresholds that specify when flow control should be initiated on full-duplex network ports. The network switch includes a queue for storing free frame pointers that specify available memory locations in an external memory for storing data frames received from a network station. The network switch takes a frame pointer from a free buffer queue for each received data frame, and stores the received data frame in the location in external memory specified by the frame pointer while a decision making engine within the switch determines the appropriate destination ports. Flow control is initiated based on the number of available frame pointers by transmitting a PAUSE frame having a selected PAUSE interval to a transmitting network station. Specifically, a full-duplex port will output a PAUSE frame having a short, medium, or long programmed pause interval if the free buffer pool of available frame pointers falls below a high, medium, or low programmable threshold, respectively. The switch thus provides flexibility in generating variable-length PAUSE control frames to minimize wasting network bandwidth.

20 Claims, 8 Drawing Sheets

METHOD AND APPARATUS PROVIDING PROGRAMMABLE THRESHOLDS FOR FULL-DUPLEX FLOW CONTROL IN A NETWORK SWITCH

RELATED APPLICATIONS

This application claims priority from provisional patent application Ser. No. 60/038,025, filed Feb. 14, 1997, entitled INTEGRATED MULTIPORT SWITCH (attorney docket 1033-230PRO), which is incorporated herein by reference.

BACKGROUND OF THE INVENTION

1. Technical Field

The present invention relates to network switching and more particularly. to methods and systems controlling network data traffic on full-duplex media in switched networks.

2. Technical Field

Switched local area networks use a network switch for supplying data frames between network stations, where each network station is connected to the network switch by a media. The switched local area network architecture uses a media access control (MAC) layer enabling a network interface card to access the media. The network switch passes data frames received from a transmitting station to a destination station based on the header information in the received data frame.

Network congestion occurs if a receiving, network element, for example a receiving network station, is unable to receive data at a rate greater than or equal to the transmission rate of the transmitting element. For example, traffic in a client-server environment is dominated by client requests followed by a burst of frames from the server to the requesting client. Hence, only a limited number of client requests can be output to the server from the switched hub at the assigned switching port. If the number of client requests exceeds the capacity of the server's port, some of the data packets will be lost. In another example, a client having limited buffer space may be unable to keep up with the transmission rate of a transmitting station, resulting in lost packets. Finally, network congestion may occur if a transmitting station attempts to transmit data packets to a receiving station that is already receiving data packets from another transmitting station. Hence, a receiving station may be unable to keep up with reception of data packets from two separate transmitting stations.

Flow control has been proposed to reduce network congestion, where a sending station temporarily suspends transmission of data packets. A proposed flow control arrangement for a duplex environment, referred to as IEEE 802.3x[2], specifies generation of a flow control message, for example a PAUSE frame. A transmitting station that receives the PAUSE frame enters a PAUSE state in which no frames are sent on the network for a time interval specified in the PAUSE frame.

The disclosed flow control proposals, however, assume that flow control should be initiated when a receive buffer is full, which still results in a loss of data. Moreover, the existing proposals do not describe how to determine the instance in which flow control should be initiated. The problem also become more complex in a switched environment, where a network switch must route data packets received from a plurality of transmitting stations to the appropriate destination stations. Moreover, if the flow control duration is too short, a receiving station may still lose portions of the transmitted data. If the duration is too long, the transmitting station remains idle, reducing network throughput.

SUMMARY OF THE INVENTION

In view of the foregoing, there is a need for an arrangement in a network switch for selectively outputting data frames from a transmitting station to a destination station that efficiently implements flow control in a manner that avoids dropped data packets and wasted network bandwidth.

There is also a need for an arrangement that selectively generates flow control signals to a transmitting station from a switched network element based on an overall global buffer capacity of the switched element for all network stations.

There is also a need for an arrangement that outputs a PAUSE frame to a transmitting station in a full-duplex network having a PAUSE interval selected based on the relative amount of data stored in the internal buffers of the switch.

These and other needs are attained by the present invention, where a network switch selectively generates a flow control signal to a transmitting station, where a PAUSE control frame is output having a PAUSE length selected based on a number of free frame pointers stored in a first queue, the free frame pointers specifying respective memory locations available for storing received data frames.

According to one aspect of the present invention, a method in a network having network stations includes the steps of setting a first queue threshold for a free pointer queue configured for storing free frame pointers, the free frame pointers specifying respective memory locations available for storing received data frames, receiving a first data frame from a first of the network station, and selectively transmitting a selected pause interval to the first transmitting station based on the first queue threshold and a number of the free frame pointers stored in the free pointer queue, the pause frame causing the first network station to halt transmission for the selected pause interval. Generation of pause frames having selected pause intervals ensures that the pause interval is minimal for minor congestion conditions, whereas longer duration pause intervals can be output if congestion is more severe. Hence, the present invention provides a particularly advantageous arrangement of managing global buffer capacity by providing a memory architecture where memory allocation is based on free frame pointers that specify memory locations available for storing received data frames, and where pause intervals are selected based on the severity of congestion.

Another aspect of the present invention provides an apparatus for outputting a data frame from a transmitting station to a destination station in a network. The apparatus includes a first port for receiving at least a portion of the data frame from the transmitting station, a free pointer queue for storing free frame pointers, the free frame pointers specifying respective memory locations available for storing received data frames, a first programmable threshold register for storing a first threshold value, a second port for outputting data frames identified for transmission to the destination station, and a controller for causing the first output port to output a pause frame having a pause interval selected based on a number of the free frame pointers relative to the first threshold value. Hence, the controller selects pause intervals, ensuring that depletion of global buffer resources is minimized without wasting network bandwidth.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the arrangement for regulation of network activity according to the present invention. It will become apparent, however, that the present invention is also applicable to other packet switched systems, as described in detail below.

SWITCH ARCHITECTURE

Figure 1:
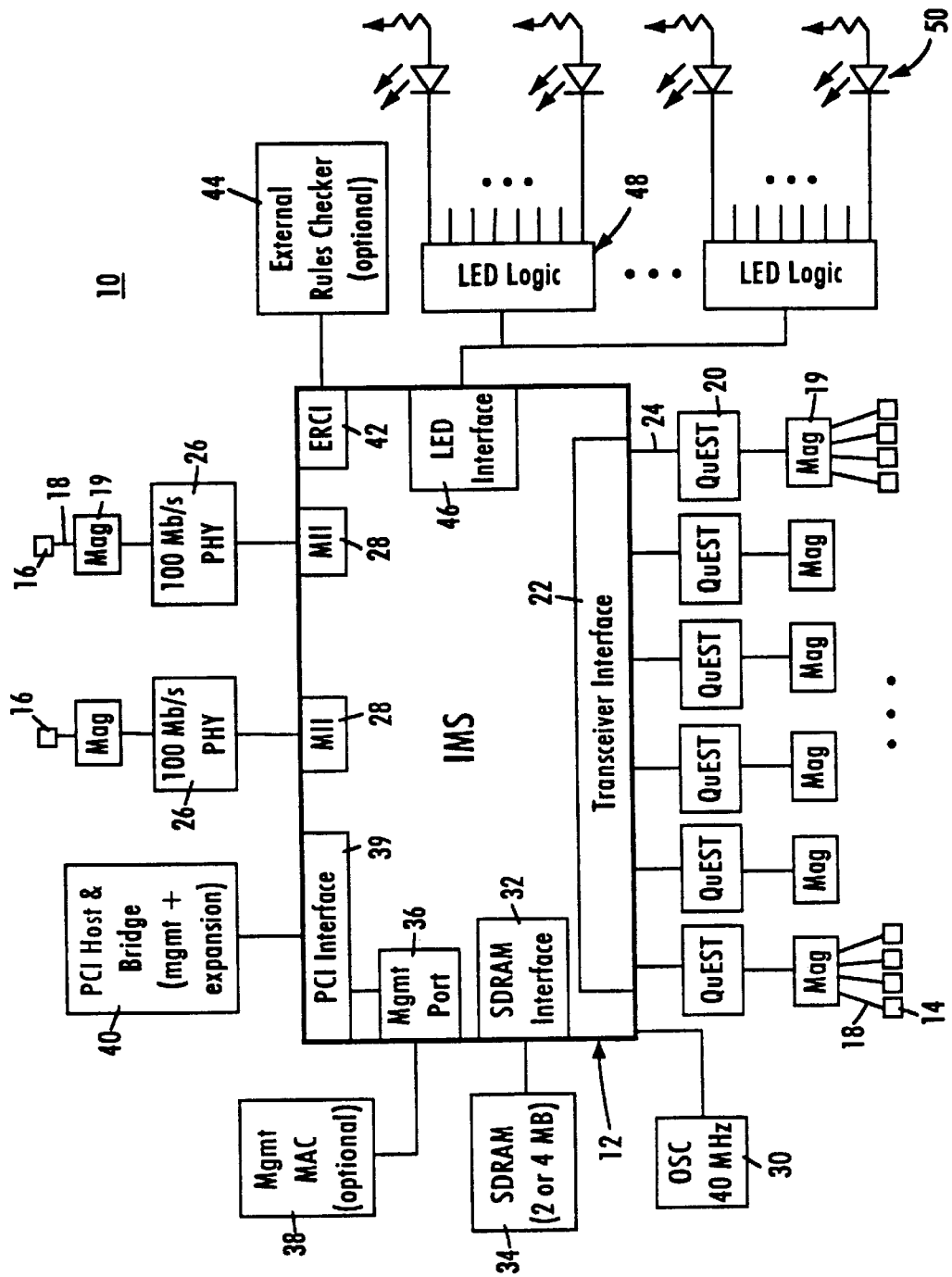
FIG. 1 is a block diagram of a packet switched system constructed in accordance with an embodiment of the present invention.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network champel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control— Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control, as described in detail below.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices 12.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2A:
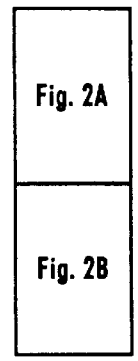
FIGS. 2A and 2B are block diagrams of a multiport switch constructed in accordance with an embodiment of the present invention and used in the packet switched system of FIG. 1.
Figure 2A:
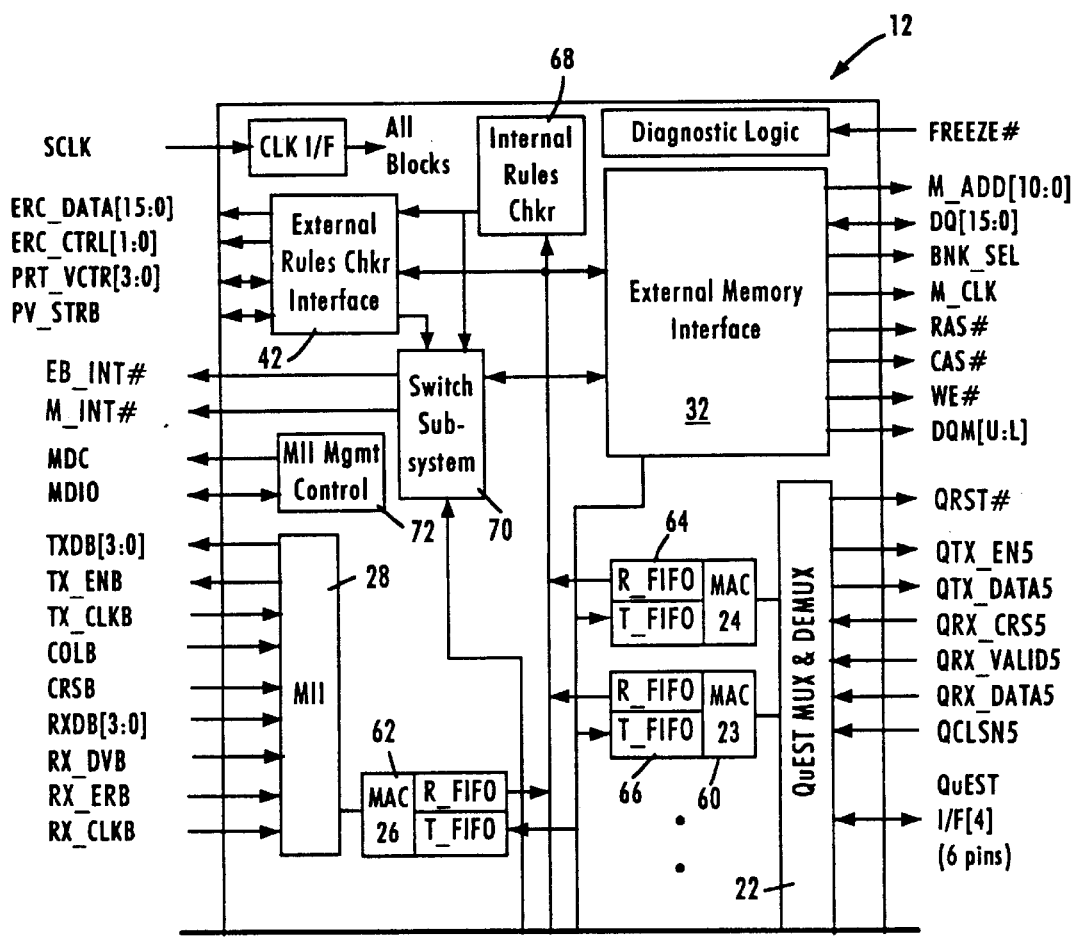
Figure 2B:
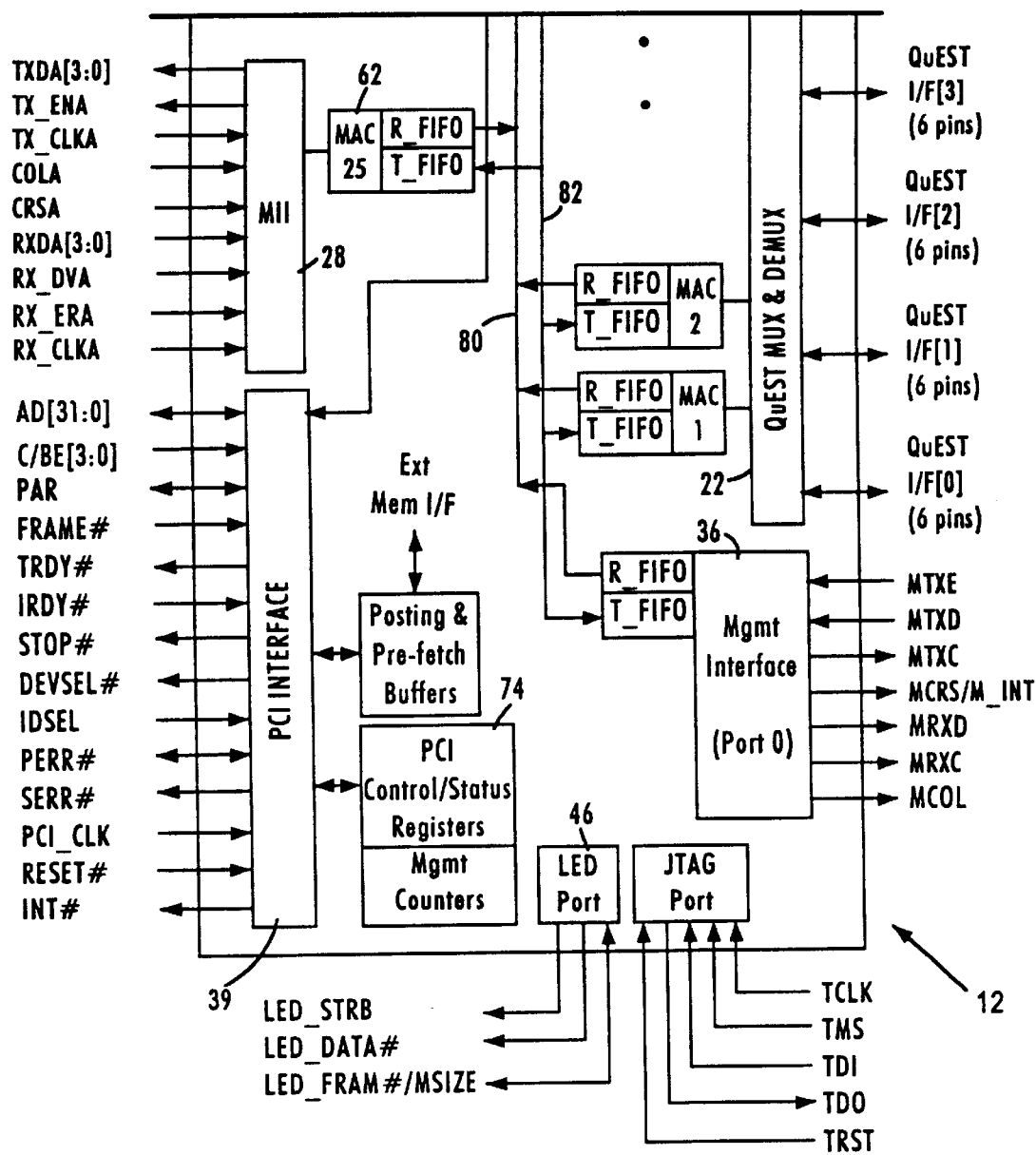

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 40 to internal IMS status and configuration registers 74, and access external memory SDRAM 3)4. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
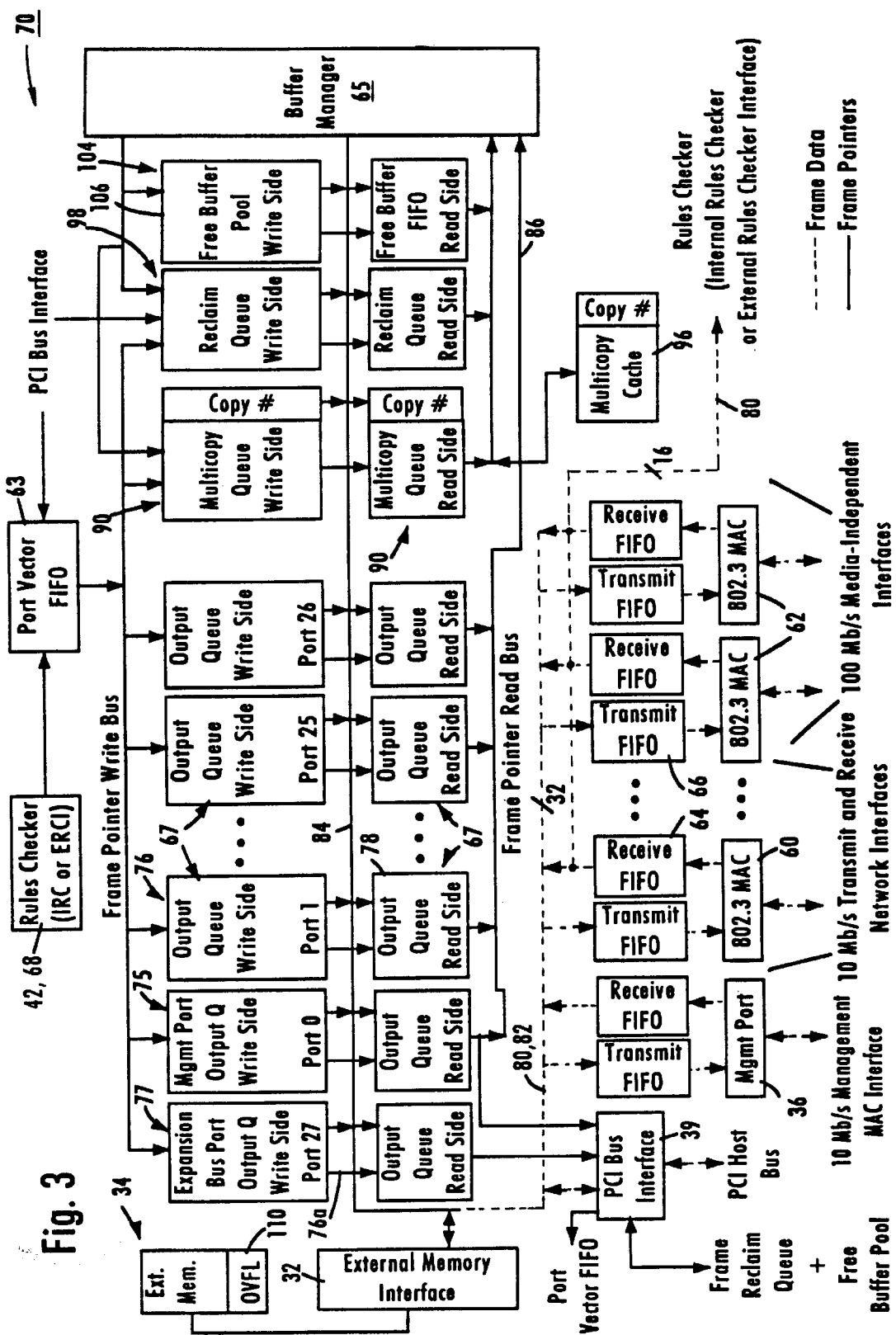
FIG. 3 is a schematic depiction of a switch subsystem of the multiport switch of FIG. 3, constructed in accordance with an embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements, The switch subsystem 70 contains the core switching engine for receiving and forwarding frames. The main functional blocks used to implement the switching, engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multipart switch 12 from the ports: unicopy frames and multicopy frames. A unicopy frame is a frame that is received at a port which is to be transmitted by the multipart switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to merely as a frame pointer, since it points to the memory location in the external memory 34 where the frame is stored. The rules checker 42 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed, and is configured within the output queue in a manner that the a relatively lower performance of the off-chip overflow area does not adversely affect the overall performance of the output queue.

Each logical queue 67, 75. 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78, and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12, and thus provides a low-latency, fast flow-through of an entry.

If the read-side queue 78 is full, but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty, and if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues 74.

The multiport switch as depicted in FIGS. 1 and 2 has twenty-eight output queues serving the twenty-four 10 Mb/s user ports 60, the two 100 Mb/s server ports 62, the management port 36, and the expansion bus port 38, respectively. The output queues 67, 75 and 77 provide temporary storage for frame pointers when they are queued for transmission. Queuing takes the form of the port vector FIFO 70 writing frame pointers into the various output queues 67, 75 and 77 indicated in a forwarding port vector.

Figure 5:
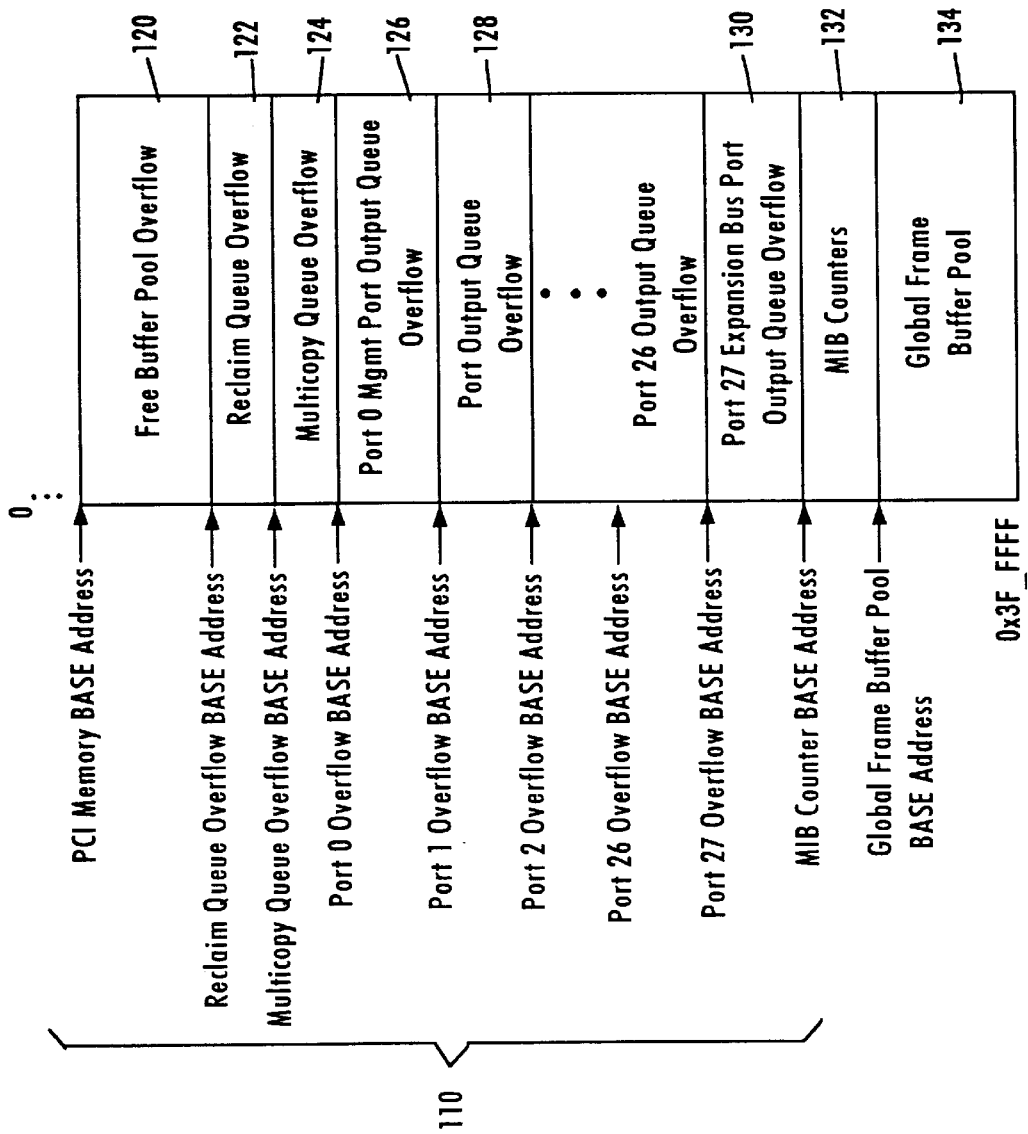
FIG. 5 is a memory map diagram of the external memory of FIG. 1, configured in accordance with an embodiment of the present invention.

FIG. 5 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12. the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits custonmization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "-1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor (not shown).

REGULATING NETWORK ACTIVITY

The present invention is directed to selectively outputting data frames from a transmitting station to a destination station. The multiport switch 12 uses flow-control to regulate inbound network activity when internal resources deplete to certain user-definable thresholds, described in detail below. Specifically, flow control is initiated when a frame received on a network port is to be supplied to a resource within the multiport switch that has limited capacity, determined by the resource contents passing a prescribed threshold. Flow control is implemented in a full-duplex port, according to the IEEE 802.3x standard, by the generation of PAUSE control frames by the MAC that inhibit transmission of data frames for a specified period of time. The multiport switch 12 supports generation of PAUSE frames by the 100 Mb/s ports 62. If desired, the 10 Mb/s ports may also be configured to provide full-duplex flow control.

Figure 4:
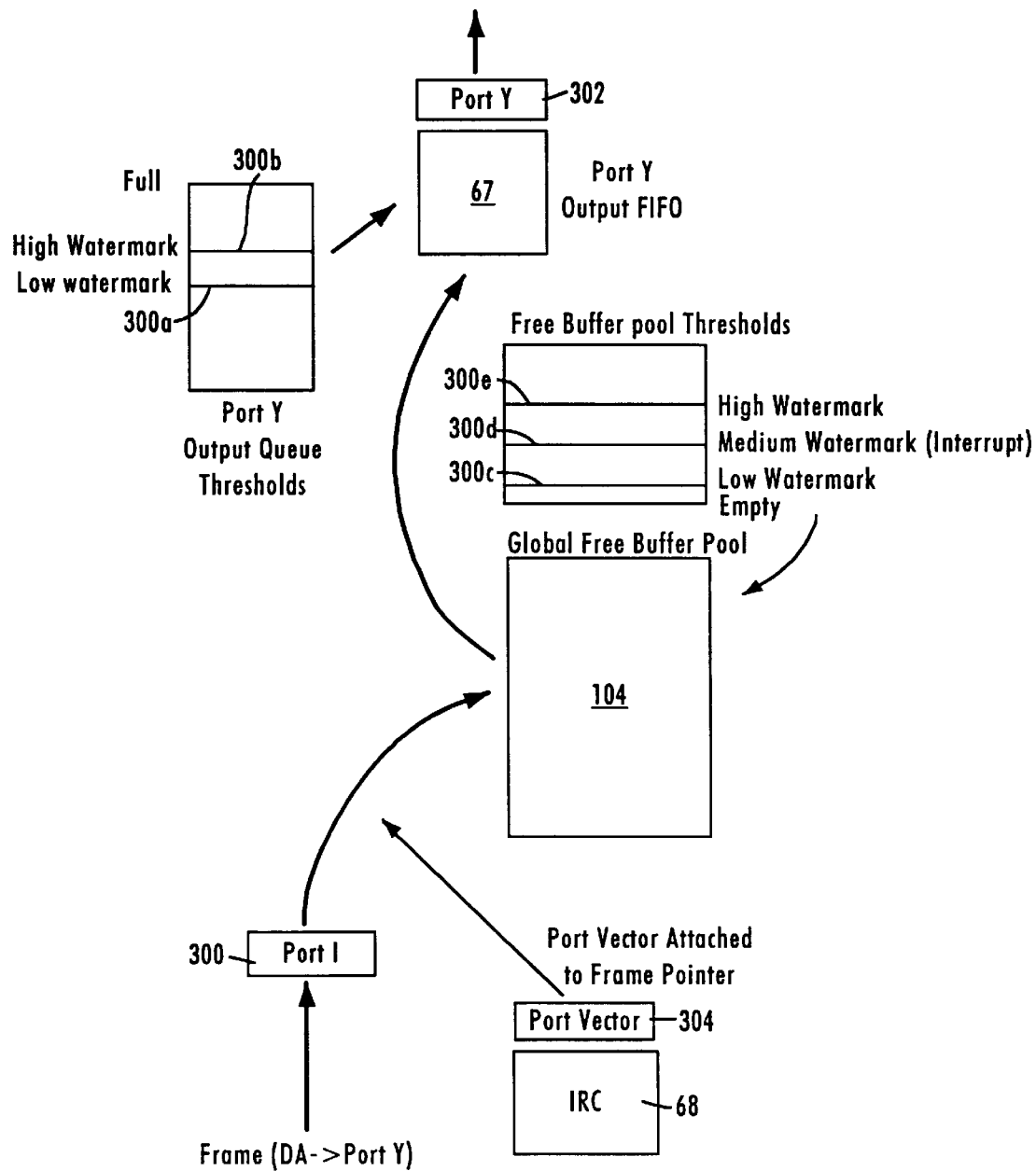
FIG. 4 is a diagram illustrating relationships between buffers and watermark threshold levels in the switch subsystem of FIG. 3 in accordance with an embodiment of the present invention.

FIG. 4 is a diagram illustrating the relationship between watermark threshold levels used to determine whether flow control should be applied relative to the associated buffers. As described below the watermark threshold levels are programmed using an external host processor 40 to selectively cause generation of PAUSE frames having variable pause intervals when buffer resources are limited.

Figure 6:
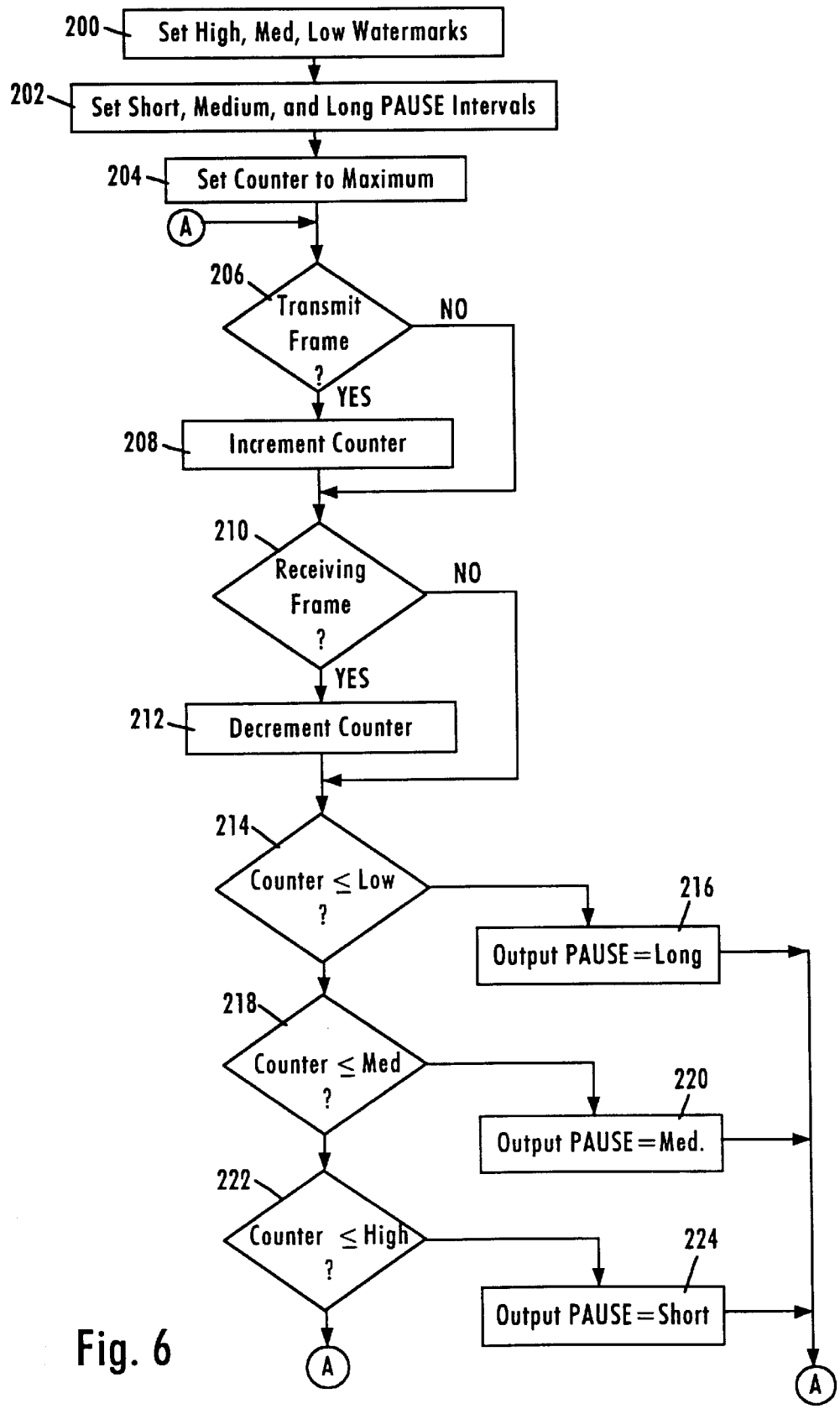
FIG. 6 is a diagram of the method for selectively outputting PAUSE frames according to an embodiment of the present invention.
Figures 7A, 7B:
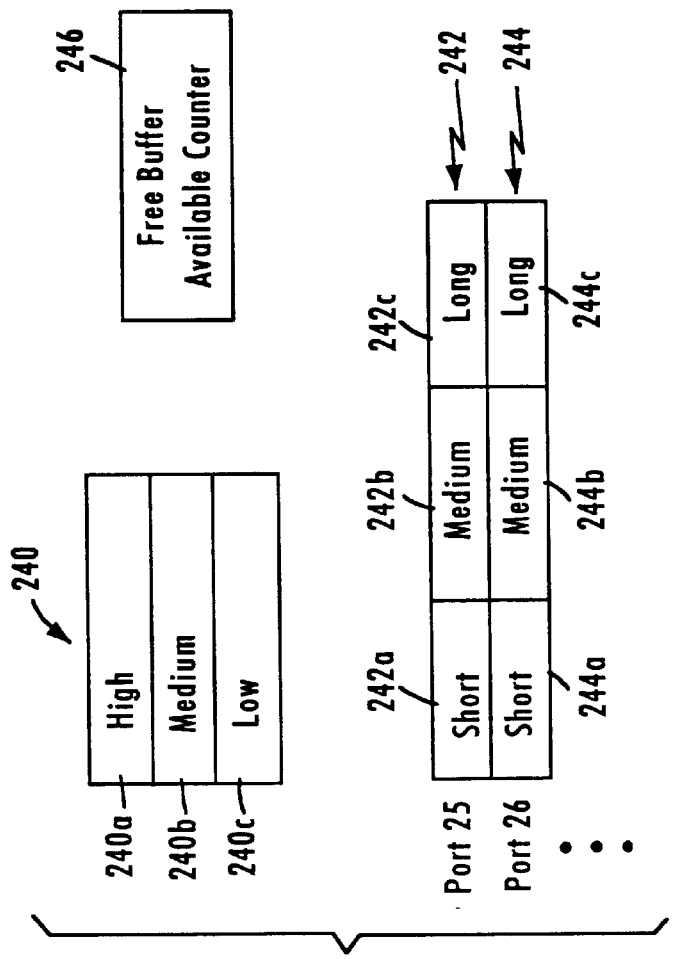
FIGS. 7A and 7B are diagrams illustrating registers within the multiport switch of FIG. 2 used for the method of FIG. 6 and an exemplary PAUSE frame, respectively.

FIG. 6 is a flow diagram of the method for controlling network activity according to an embodiment of the present invention. The disclosed method is preferably executed under the control of a host processor 40 having access to the multiport switch 12 via either the PCI interface 39 or the management port 36. The method begins in step 200 by setting high, medium and low watermark levels 300 for the free buffer pool 104 as shown in FIG. 4. FIG. 7A is a diagram illustrating at least a portion of the control registers 74 of FIG. 2 that are programmable by the host processor 40. As shown in FIG. 7A, the control registers 74 include a set of threshold registers 240a, 240b, and 240c for storing the high, medium, and low watermark threshold levels 300e, 300d, and 300c. respectively. As illustrated in FIG. 4, the medium watermark threshold level 300d stored in register 240b is less than the high watermark level 300e stored in register 240a, and the low watermark level 300c stored in register 240c is less than the medium watermark level 300d stored in register 240b. The threshold levels in registers 240 are set according to a maximum number of free frame pointers stored in the write-side queue 76, the read-side queue 78, and the free buffer pool overflow portion 120 of the external memory 34.

The host processor 40 then sets short, medium and long PAUSE intervals in step 202 between a range of zero and 65,535 slot times. Specifically, the control status registers 74 includes a first set of programmable PAUSE configuration registers 242. The PAUSE configuration registers 242a, 242b, and 242c store short, medium and long PAUSE intervals as specified by the host controller for one of the 100 Mb/s ports (e.g., port 25). The short, medium, and long PAUSE frames specified in registers 242a, 242b, and 242c may have exemplary values of 5 slot times, 100 slot times, and 1024 slot times, respectively. The registers 74 also include a second set of programmable registers 244, where registers 244a, 244b, and 244c store a different set of short, medium and long PAUSE intervals, respectively, for the second 100 Mb/s port 26. Additional PAUSE configuration registers may be provided if the 10 Mb/s ports are also configured for full-duplex operation enabling flow control by generation of PAUSE frames. Hence, storing three sets of PAUSE frames for each port provides flexibility in network design, enabling a host processor 40 to adjust each individual port based on network traffic. Alternatively, the disclosed arrangement may be simplified by using a single set of configuration registers storing short, medium, and long PAUSE intervals to be used by all the ports in common.

The management counters 74 include a free buffer counter 246 for counting the number of free frame pointers in the write-side portion 76 of free buffer pool 104, the read-side portion 78 of the free buffer pool 104, and the overflow portion 120 in the external memory 34. The host processor 40 in step 204 sets the free buffer counter 246 to a maximum value that corresponds to the overall capacity of the write-side portion 76, the read-side portion 78, and the overflow portion 120 of the free buffer pool 104.

After the host processor 40 has set up the multiport switch 12 in steps 200, 202, and 204, the host processor 40 initiates the multiport switch 12 to begin reception and transmission of data frames. The free buffer counter 246 will begin to decrement as free frame pointers are taken from the free buffer pool 104 to store received data packets in the external memory 34. Similarly, the free buffer counter 246 will be incremented as the frame pointers are returned to the free buffer pool 104 after stored data packets are output from the switch, freeing up resources in the external memory 34.

At this point, the buffer manager 65 manages the allocation of frame pointers to and from the free buffer pool 104. Specifically, the buffer manager 65 determines in step 206 if a frame is to be transmitted by determining if a frame pointer is available from the read-side portion 78 of an appropriate output queue 67. If the buffer manager 65 determines that a frame is to be output, the buffer manager 65 fetches the data from the external memory 34 based upon the corresponding frame pointer, places the retrieved data packet in the appropriate transmit FIFO 66 for the appropriate destination port, and restores the assigned frame pointer to the write-side portion 76 of the free buffer pool 104. Once the frame pointer is returned to the free buffer pool 104, the buffer manager 65 increments the counter 246 in step 208.

If the buffer manager 65 determines in step 206 that no frame is to be currently transmitted, the buffer manager 65 determines in step 210 if a frame is received by the multiport switch 12 determining whether a data frame in a receive FIFO 64 needs to be stored in the external memory 34. If data needs to be stored in the external memory 34, the buffer manager 65 obtains an assigned frame pointer from the read-side 78 of the free buffer pool 104, and decrements the counter 246 in step 212.

The buffer manager 65 then checks in step 214 whether the free buffer counter 246 indicates that the resources of the free buffer pool are limited, requiring generation of a PAUSE frame. Specifically, the buffer manager 65 monitors the free buffer available counter 246 and generates PAUSE flow control frames based on the following rules:

1. If the free buffer pool 104 is reduced below the high watermark 300e, a PAUSE flow control frame will be transmitted on both 100 Mb/s ports (ports 25, 26) with the short PAUSE length interval as specified in registers 242a and 244a, respectively.
2. If the free buffer pool 104 is reduced below the medium watermark 300d, a PAUSE flow control frame will be transmitted on both 100 Mb/s ports with the medium PAUSE length interval as specified in registers 242b and 244b, respectively.
3. If the free buffer pool 104 is reduced below the low watermark 300c, a PAUSE flow control frame will be transmitted on both 100 Mb/s ports with the long PAUSE length interval as stored in registers 242c and 244c, respectively.

As shown in FIG. 6, the buffer manager 65 may implement these three rules by first checking in step 214 if the free buffer counter 246 is less than or equal to the low threshold stored in register 240c. If the value of the free buffer counter 246 is less than or equal to the low watermark stored in register 240c the buffer manager 65 outputs a command in step 216 to the appropriate MAC layers 62 to generate a PAUSE frame carrying the long PAUSE duration as specified in registers 242c and 244c, respectively. An exemplary PAUSE frame is illustrated in FIG. 7B, and includes a destination address field (DA) specifying the address station to receive the PAUSE frame, a source address field (SA), a field for Type/Length information, a control field having the Opcode identifier for a PAUSE frame, and the PAUSE length as a number of slot times.

If the free buffer counter 246 has not passed below the low threshold watermark 300c, the buffer manager 65 checks in step 218 if the value of the free buffer counter 246 is less than or equal to the medium watermark threshold 300d stored in register 240b. If the free buffer counter 246 has passed below the medium watermark threshold 300d, then the buffer manager 65 sends a command in step 220 to the appropriate MAC layer 62 to output PAUSE frames carrying the medium-length PAUSE interval specified in registers 242b and 244b, respectively. If the buffer manager 65 determines in step 218 the free buffer counter 246 has not yet passed below the medium watermark threshold 300d, the buffer manager 65 checks in step 222 whether the free buffer counter 246 has passed below the high watermark 300e stored in register 248. If the free buffer counter 246 has passed below the high watermark 300e, the buffer manager 65 in step 224 causes the appropriate MACs 62 to output a PAUSE frame specifying the short PAUSE interval specified in registers 242a and 244a, respectively.

Hence, the buffer manager 65 monitors the available resources in the free buffer pool 104 and generates PAUSE control frames having selected pause durations based on the number of free frame pointers in the queue 104. A reduction in the free buffer pool 104 below the high watermark 300e causes each MAC layer enabled for full-duplex flow control to output the PAUSE control frame having the corresponding short PAUSE interval. If the short PAUSE interval is ineffective and the resources of the global free buffer pool 104 continue to be depleted until the free buffer counter 246 passes below the medium watermark 300d, then each enabled MAC layer outputs a second PAUSE control frame having a longer duration as specified in the corresponding register (e.g., register 242b or 244b), in an effort to further scale back the rate of incoming data frames from the network stations. During the PAUSE intervals, the multiport switch 12 will generally attempt to clear out its output buffers and overflow buffers in order to restore assigned frame pointers back to the free buffer pool 104. If the rate of incoming data frames is sufficiently severe that the free buffer counter 246 passes below the low watermark 300e specified in register 240c, then the buffer manager 65 causes the appropriate MACs to output the long PAUSE duration, for example, as specified in registers 242c and 244c.

Hence, the multiport switch 12 selectively controls data traffic by monitoring the global resources, and selectively generating PAUSE control frames based on the amount of global resources relative to prescribed thresholds. If the global resources become diminished, the multiport switch 12 will output a set of PAUSE frames to the appropriate transmitting stations. However, if global resources continue to be depleted, then additional PAUSE control frames having successively longer PAUSE durations will be sent.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

We claim:

1. A method in a network having network stations, the method comprising:

setting a first queue threshold for a free pointer queue configured for storing free frame pointers, the free frame pointers specifying respective memory locations available for storing received data frames;

receiving a first data frame from a first of the network stations; and selectively transmitting a pause frame specifying a selected pause interval to the first transmitting station based on the first queue threshold and a number of the free frame pointers stored in the free pointer queue, the pause frame causing the first network station to halt transmission for the selected pause interval, wherein the selectively transmitting step comprises transmitting the pause frame when the number of free frame pointers falls below the first queue threshold.

2. A method in a network having network stations, the method comprising:

setting a first queue threshold for a free pointer queue configured for storing free frame pointers, the free frame pointers specifying respective memory locations available for storing received data frames;

receiving a first data frame from a first of the network stations;

selectively transmitting a pause frame specifying a selected pause interval to the first transmitting station based on the first queue threshold and a number of the free frame pointers stored in the free pointer queue, the pause frame causing the first network station to halt transmission for the selected pause interval;

setting a second queue threshold level less than the first queue threshold for the free pointer queue; and setting a first delay interval and a second delay interval longer than the first delay interval, wherein the selectively transmitting step comprises selecting one of the first and second delay intervals as the selected pause interval based on the number of free frame pointers falling below the first and second thresholds, respectively.

3. The method of claim 2, further comprising setting a third queue threshold level less than the second queue threshold and a third delay interval longer than the second delay interval, the selecting step selecting one of the first, second, and third delay intervals as the selected pause interval based on the number of free frame pointers falling below the first, second and third thresholds, respectively.

4. The method of claim 3, wherein the selectively transmitting step further comprises outputting the pause frame to a plurality of the network stations simultaneously.

5. A method in a network having network stations, the method comprising:

setting a first queue threshold for a free pointer queue configured for storing free frame pointers, the free frame pointers specifying respective memory locations available for strong received data frames;

receiving a first data frame from a first of the network stations;

selectively transmitting a pause frame specifying a selected pause interval to the first transmitting station based on the first queue threshold and a number of the free frame pointers stored in the free pointer queue, the pause frame causing the first network station to halt transmission for the selected pause interval;

obtaining one of the free frame pointers from the free pointer queue for storing the received first data frame; and decrementing a counter corresponding to the number of the free frame pointers.

6. The method of claim 5, further comprising storing the received first data frame in an external memory at the available location specified by the obtained free frame pointer.

7. The method of claim 6, further comprising:

outputting the received first data frame stored in the external memory to a destination network station;

restoring the obtained free frame pointer specifying the memory location of the output first data frame to the free pointer queue as a free frame pointer; and incrementing the counter based the restoring of the assigned data frame to the free pointer queue.

8. The method of claim 7, wherein the outputting step comprises:

supplying the obtained free frame pointer to an input end of a port buffer corresponding to the destination network station;

accessing the first data frame from the external memory in response to retrieving the obtained free frame pointer from an output end of the port buffer; and transmitting the accessed first data frame to the destination network station.

9. The method of claim 5, further comprising:

outputting one of the received data frames;

restoring an assigned frame pointer specifying the memory location of the one output data frame to the free pointer queue as a free frame pointer; and incrementing the counter based the restoring of the assigned data frame to the free pointer queue.

10. A method in a network having network stations, the method comprising:

setting a first queue threshold for a free pointer queue configured for storing free frame pointers, the free frame pointers specifying respective memory locations available for storing received data frames;

receiving a first data frame from a first of the network stations;

selectively transmitting a pause frame specifying a selected pause interval to the first transmitting station based on the first queue threshold and a number of the free frame pointers stored in the free pointer queue, the pause frame causing the first network station to halt transmission for the selected pause interval; and setting the pause interval to equal a selected number of slot times based on a reduction in the number of free frame pointers relative to the first queue threshold.

11. The method of claim 10, wherein the setting step comprises selecting the number of slot times from a range between and including zero and 65535 slot times.

12. A method in a network switch for selectively outputting a data frame from a transmitting station to a destination station, comprising:

setting a first queue threshold and a second queue threshold less than the first queue threshold for a free pointer queue configured for storing free frame pointers, the free frame pointers specifying respective memory locations available for storing received data frames;

setting a first delay interval and a second delay interval longer than the first delay interval;

receiving a first data frame from the transmitting station; and transmitting a pause frame specifying a selected pause interval to the transmitting station, the pause interval selected from at least one of the first and second delay intervals based a number of the stored free frame pointers falling below at least one of the first and second queue thresholds, respectively.

13. The method of claim 12, further comprising:

setting a queue counter, corresponding to the number of stored free frame pointers, to a prescribed maximum value;

decrementing the queue counter in response to storage of the first data frame using one of the free frame pointers obtained from the free pointer queue; and incrementing the queue counter in response to transmitting the first data frame to a destination station and returning the one of the free frame pointers to the free pointer queue.

14. The method of claim 13, further comprising:

setting a third queue threshold less than the first and second queue thresholds;

setting a third delay interval longer than the first and second delay intervals; and selecting one of the first, second, and third delay intervals as the selected pause interval based on the queue counter falling below the first, second, and third thresholds, respectively.

15. An apparatus for outputting a data frame from a transmitting station to a destination station in a network, comprising:

a first port for receiving at least a portion of the data frame from the transmitting station;

a free pointer queue for storing free frame pointers, the free frame pointers specifying respective memory locations available for storing received data frames, a first programmable threshold register for storing a first threshold value;

a second port for outputting data frames identified for transmission to the destination station;

a controller for causing the first output port to output a pause frame having a pause interval selected based on a number of the free frame pointers relative to the first threshold value; and a first set of programmable pause configuration registers storing first, second, and third pause intervals, the controller selecting one of the first, second, and third pause intervals as the selected pause interval based on the number of the free frame pointers.

16. The apparatus of claim 15, further comprising a second set of programmable pause configuration registers storing fourth, fifth, and sixth pause intervals, the controller causing the second output port to output a second pause frame carrying a selected one of the fourth, fifth, and sixth pause intervals based on the number of free frame pointers relative to the first threshold value.

17. The apparatus of claim 16, further comprising:

a second programmable threshold register for storing a second threshold value less than the first threshold value;

a third programmable threshold register for storing a third threshold value less than the second threshold value;

wherein:

(1) the controller, in response to the number of free frame pointers falling below the first threshold value, selectively causes the first and second output ports to output pause frames carrying the first and fourth pause intervals, (2) the controller, in response to the number of free frame pointers falling below the second threshold value, selectively causes the first and second output ports to output pause frames carrying the second and fifth pause intervals, and (3) the controller, in response to the number of free frame pointers falling below the third threshold value, selectively causes the first and second output ports to output pause frames carrying the third and sixth pause intervals.

18. The apparatus of claim 15, further comprising:

a second programmable threshold register for storing a second threshold value less than the first threshold value;

a third programmable threshold register for storing a third threshold value less than the second threshold value;

wherein the controller selectively causes the first output port to output pause frames carrying the first, second, and third pause intervals in response to the number of free frame pointers falling below the first, second, and third threshold values, respectively.

19. An apparatus for outputting a data frame from a transmitting station to a destination station in a network, comprising:

a first port for receiving at least a portion of the data frame from the transmitting station;

a free pointer queue for storing free frame pointers, the free frame pointers specifying respective memory locations available for storing received data frames, a first programmable threshold register for storing a first threshold value;

a second port for outputting data frames identified for transmission to the destination station;

a controller for causing the first output port to output a pause frame having a pause interval selected based on a number of the free frame pointers relative to the first threshold value; and a counter counting the number of the free frame pointers in the free pointer queue, the controller decrementing the queue counter in response to storage of the first data frame using one of the free frame pointers obtained from the free pointer queue, and incrementing the queue counter in response to returning the one of the free frame pointers to the free pointer queue after transmission of the first data frame.

20. The apparatus of claim 19, further wherein the free pointer queue comprises:

a write-side queue receiving the corresponding frame pointer at an input end and selectively outputting the corresponding frame pointer at an output end to a corresponding assigned portion of an external memory; and a read-side queue selectively receiving the corresponding frame pointer stored in the write-side queue from one of the output end of the write-side queue and the corresponding assigned portion of the external memory, the controller selectively storing the corresponding frame pointer in the assigned portion of the external memory based on a second number of the corresponding frame pointers stored in the read-side queue;

wherein the counter counts the number of free frame pointers in the write-side queue, the assigned portion of the external memory, and the read-side queue.

* * * * *